United States Patent
Bhatnagar

(10) Patent No.: US 8,043,433 B2
(45) Date of Patent: Oct. 25, 2011

(54) HIGH EFFICIENCY ELECTRO-STATIC CHUCKS FOR SEMICONDUCTOR WAFER PROCESSING

(75) Inventor: Ashish Bhatnagar, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 36 days.

(21) Appl. No.: 12/028,883

(22) Filed: Feb. 11, 2008

(65) Prior Publication Data

US 2009/0199765 A1    Aug. 13, 2009

(51) Int. Cl.
*H02N 13/00* (2006.01)

(52) U.S. Cl. ............ 118/728; 156/345.51; 361/234; 279/128

(58) Field of Classification Search ............ 118/728, 118/729, 730, 731, 732; 156/345.51, 345.52, 156/345.53, 345.54, 345.55; 361/234; 279/128
See application file for complete search history.

(56) References Cited

U.S. PATENT DOCUMENTS

| | | |
|---|---|---|
| 5,606,485 A | 2/1997 | Shamouilian et al. |
| 5,691,876 A | 11/1997 | Chen et al. |
| 5,745,331 A | 4/1998 | Shamouilian et al. |
| 5,753,132 A | 5/1998 | Shamouilian et al. |
| 5,822,171 A | 10/1998 | Shamouilian et al. |
| 5,986,875 A | 11/1999 | Donde et al. |
| 6,094,334 A * | 7/2000 | Bedi et al. ............ 361/234 |
| 6,219,219 B1 * | 4/2001 | Hausmann et al. ....... 361/234 |
| 6,490,144 B1 | 12/2002 | Narendrnath et al. |
| 6,557,248 B1 | 5/2003 | Shamouilian et al. |
| 6,709,609 B2 | 3/2004 | Hwang et al. |

OTHER PUBLICATIONS

ThomasNet. Manufactured Polymer Meets Strict Requirements for Purity. Jul. 21, 2004. Published by ThomasNet. Printed on Jul. 28, 2009 from http://news.thomasnet.com/fullstory/453647.*
International Search Report and Written Opinion dated Sep. 17, 2009 for International Application No. PCT/US2009/033032.

* cited by examiner

*Primary Examiner* — Sylvia R. MacArthur
(74) *Attorney, Agent, or Firm* — Patterson & Sheridan, L.L.P.

(57) ABSTRACT

The present invention generally provides a high efficiency electrostatic chuck for holding a substrate in a processing volume. The high efficiency electrostatic chuck includes an electrode embedded within a high-purity, thermoplastic member. In particular, the high-purity, thermoplastic member may include a high-purity, polyaryletherketone having an extremely low level of metallic ions present therein. The high-purity, polyaryletherketone has excellent wear resistance, high temperature resistance, plasma resistance, corrosive chemical resistance, electrical stability, and strength as compared to polyimide films used in electrostatic chucks. The present invention also provides a simplified method of manufacturing the high efficiency electrostatic chuck.

15 Claims, 3 Drawing Sheets

HIGH EFFICIENCY ELECTRO-STATIC CHUCKS FOR SEMICONDUCTOR WAFER PROCESSING

BACKGROUND OF THE INVENTION

1. Field of the Invention

Embodiments of the present invention generally relate to electrostatic chucks for holding a substrate in a process environment.

2. Description of the Related Art

In substrate processing applications, chucks are used to hold a substrate to prevent movement or misalignment of the substrate during processing. Electrostatic chucks use electrostatic attraction forces to hold a substrate in position. The use of electrostatic chucks has gained wide acceptance due to their advantages over mechanical and vacuum chucks, such as the reduction of stress related cracking in the substrate, the reduction of contamination in the processing chamber, and the ability to retain a substrate in a low vacuum environment.

A typical electrostatic chuck includes an electrically conductive electrode embedded within an electrical insulator. A voltage source electrically biases the substrate with respect to the electrode. The insulator prevents the flow of electrons therethrough, causing opposing electrostatic charges to accumulate in the substrate and in the electrode. Thus, an electrostatic force is generated to attract and hold the substrate onto the chuck.

A common electrostatic chuck is a multilayered structure fabricated using polyimide for the insulating layers sandwiching a copper electrode. Polyimide is a thermosetting material that has desirable properties such as high temperature stability (relative to other organic polymers), good dielectric behavior, and good mechanical properties. However, the use of polyimide to insulate the electrode limits the lifetime of the chuck in certain substrate fabrication processes. Polyimide and similar polymers have low erosion resistance for certain process gases and plasmas. Oxygen-containing gases and plasmas, which are used for a variety of substrate processing operations, are particularly detrimental to the polyimide layers on the electrostatic chuck. During these processes, the insulator can be eroded by the process gas and the resultant exposure of the electrode results in failure of the chuck during processing and loss of the entire substrate at a significant cost.

In addition, when a substrate breaks or chips to form fragments having sharp edges, the substrate fragments can easily puncture the polyimide film exposing the electrode of the chuck. Substrate fragments can also be transferred to the polyimide film from the substrate backside. Exposure of the electrode at even a single pinhole in the insulator can cause arcing between the electrode and plasma, and require replacement of the entire chuck.

Further, the process of manufacturing the aforementioned electrostatic chuck requires the use of pressure or heat sensitive adhesives as well as a laborious circuit buildup. For instance, a polyimide film having an electrically conductive copper layer may be supplied. The copper layer may be etched, routed, or milled to form the electrode. After etching, a second polyimide film layer may be adhered over the electrode layer using a pressure or heat sensitive adhesive. The multilayer stack is then adhered to the base of the chuck using a pressure or temperature sensitive adhesive. This process is not only complicated, requiring many steps and extended fabrication time, but the adhesive layers may also be detrimentally affected by process conditions within certain process chambers. This may result in delamination of the layers, requiring replacement of the entire chuck.

Therefore, a need exists for an improved electrostatic chuck and a simplified method of manufacturing the same.

SUMMARY OF THE INVENTION

In one embodiment of the present invention, a multilayer electrostatic chuck comprises a high-purity polyaryletherketone member having a low concentration of metallic ions, wherein the high-purity polyaryletherketone member acts as a dielectric within the electrostatic chuck, and a preformed electrode embedded within the high-purity polyaryletherketone member.

In another embodiment of the present invention, an electrostatic chuck assembly comprises a substrate support platen, a first polyaryletherketone layer having a first surface thermoplastically bonded to the substrate support platen, a second polyaryletherketone layer having a second surface configured to support a substrate, and an electrode member embedded between the second surface of the first polyaryletherketone layer and the first surface of the second polyaryletherketone layer, wherein the first and second polyaryletherketone layers are thermoplastically bonded together.

In yet another embodiment of the present invention, a method of fabricating an electrostatic chuck assembly comprises placing a preformed electrode between a first high purity polyaryletherketone layer and a second high-purity polyaryletherketone layer, thermoplastically bonding the first and second high purity polyaryletherketone layers together, and thermoplastically bonding the first polyaryletherketone layer to a substrate support platen.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention generally provides a high efficiency electrostatic chuck for holding a substrate in a processing volume. The high efficiency electrostatic chuck includes an electrode embedded between two layers of a high-purity, thermoplastic film. In particular, the high-purity, thermoplastic film may be a high-purity polyaryletherketone having an extremely low level of metallic ions present therein. High-purity polyaryletherketone has excellent wear resistance, high temperature resistance, plasma resistance, corrosive chemical resistance, electrical stability, and strength as compared to polyimide films currently used in electrostatic chucks. The present invention also provides a simplified method of manufacturing the high efficiency electrostatic chuck.

Figure 1:
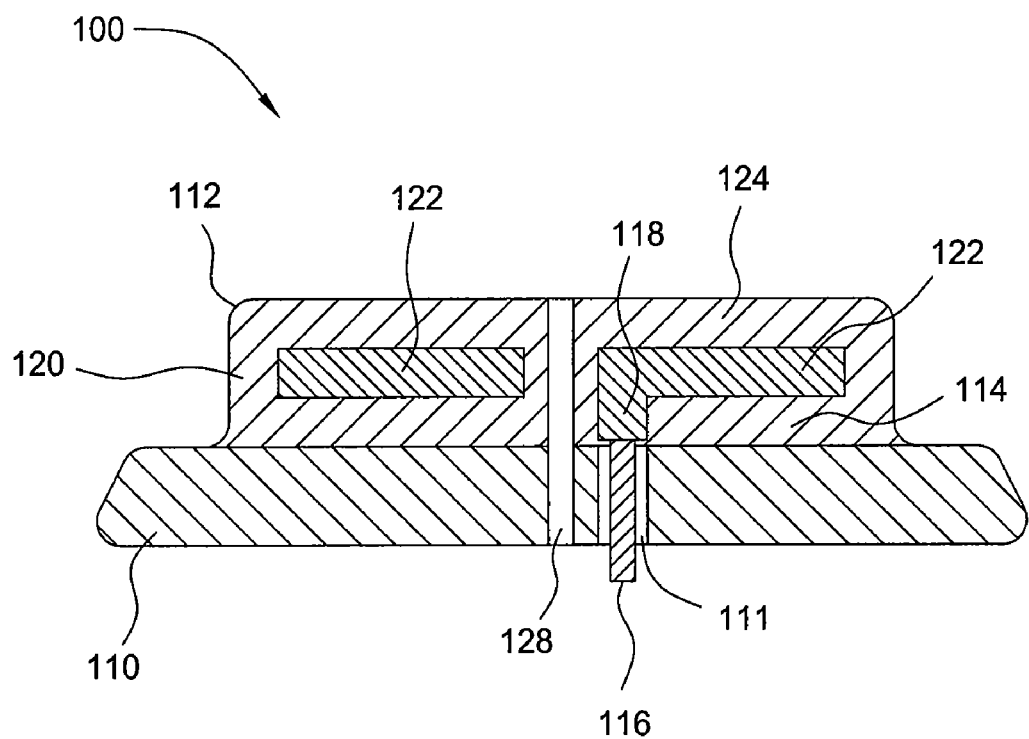
FIG. 1 is a schematic, cross-sectional view of an embodiment of an electrostatic chuck assembly according to the present invention.

FIG. 1 is a schematic, cross-sectional view of an embodiment of an electrostatic chuck assembly 100 according to the present invention. The electrostatic chuck assembly 100 includes an electrostatic chuck 112 atop a substrate support platen 110. Electrostatic chuck 112 comprises a dielectric member 120 bonded to the substrate support platen 110. An electrode 122 is embedded within the dielectric member 120. The electrode 122 may be preconfigured into various geometries and may be monopolar or bipolar. In one embodiment, the dielectric member 120 may comprise a first dielectric layer 124 bonded to the substrate support platen 110 and having the preformed electrode 122 configured thereon. A second dielectric layer 114 may be configured atop the electrode 122 and the first dielectric layer 124 and bonded thereto.

The substrate support platen 110 may include an opening 111 through which a conductive extension 116 may extend to furnish an electrical contact surface 118 through which power may be connected to the electrode 122. High voltage ranging from about 200 V to about 2,000 V may be applied to the electrode 122 to create polarization of the insulating dielectric films, creating static electricity on the surface of the second dielectric layer 114, such that the substrate is attracted and held on the support platen 110 by the coulomb force of this static electricity.

To provide improved heat transfer to the substrate, which is held to the surface of the second dielectric layer 114, a heat transfer gas may be fed to the surface of dielectric layer 114 through a conduit 128. Conduit 128 may lead to gas directing channels in the surface of the dielectric layer 114 (not shown). The channels may take various geometrical forms. Heat transfer gas may be fed through conduit 128 to the gas directing channels during processing of the substrate.

Both the first dielectric layer 124 and the second dielectric layer 114 of the electrostatic chuck 112 may be formed from a high-purity, thermoplastic film, such as a high-purity polyaryletherketone having an extremely low level of metallic ions present therein. In this context, high-purity is defined as having no greater than one part per million of each of the following metals: aluminum, antimony, arsenic, barium, beryllium, bismuth, boron, cadmium, calcium, chromium, cobalt, copper, gallium, germanium, hafnium, indium, iron, lead, lithium, mercury, magnesium, manganese, molybdenum, nickel, niobium, phosphorus, potassium, rubidium, scandium, selenium, silicon, silver, sodium, strontium, sulfur, tantalum, tellurium, thallium, tin, titanium, tungsten, vanadium, yttrium, zinc, and zirconium.

High-purity polyaryletherketone has excellent strength and puncture resistance as compared to traditional thermoplastic polyimide films. As previously described, substrate particles may be transferred to the surface of electrostatic chuck 112 from the backside of the wafer or from wafer breakage. Puncture of the first dielectric layer 124 may result in arcing between the electrode 122 and the plasma in the chamber. Therefore, the use of high-purity polyaryetherketone in the dielectric layers significantly extends the life of the electrostatic chuck 112 by providing protection from substrate particle puncture.

Additionally, high-purity polyaryletherketone has excellent high temperature resistance, such that the electrostatic chuck 112 may be used in processing environments having a temperature in excess of 200° C. High-purity polyaryletherketone also exhibits excellent chemical resistance to a wide range of chemical environments, including alkalis, aromatic hydrocarbons, alcohols, and hydrogenated hydrocarbons.

High-purity polyaryletherketone has excellent plasma resistance as well. For instance, a pre-clean etch plasma with 100% oxygen ($O_2$) gas may result in less than 0.14 g/cm$^2$ mass loss in 100 hours of plasma etch performed on a 10.3 cm$^2$ plaque. This characteristic allows the surface of the electrostatic chuck 112 to be pretreated and cleaned to optimize chucking parameters without the need to open the chamber and expose the chamber to contaminants, as is required for cleaning an electrostatic chuck constructed of polyimide films.

High-purity polyaryletherketone is also resistant to a number of highly corrosive gases. For example, the electrostatic chuck 112 may be used in processing environments having corrosive gases, such as chlorine (Cl2), boron trichloride (BCl3), tetrafluoromethane (CF4), and trifluoromethane (CHF3), without the need for an additional protective covering.

An example of a high-purity polyaryletherketone suitable for use in the present invention is VICTREX Ultra-High Purity (UHP) PEEK polyaryletherketone (UHP PEEK) manufactured by Victrex plc located in Lancashire, England.

The electrostatic chuck 112 of FIG. 1 further benefits from use of high-purity polyaryletherketone in simplicity and ease of manufacturing as compared to traditional polyimide films. One advantage to using high-purity polyaryletherketone in forming the first dielectric layer 124 and the second dielectric layer 114 is due to the thermoplastic characteristics of the material. As previously discussed, creating multilayered stacks of an electrostatic chuck using polyimide, requires building up a copper circuit atop a first dielectric layer and adhering a second dielectric layer atop the stack via a pressure or heat sensitive adhesive. In contrast, an embodiment of a manufacturing method according to the present invention does not require the buildup step or the adhesive step.

According to a method of the present invention, the electrode 122, such as a copper electrode, may be preformed and embedded between the first dielectric layer 124 and the second dielectric layer 114. This assembly may then be pressed and thermoplastically bonded to form the electrostatic chuck 112. The electrostatic chuck 112 may then be pressed and thermoplastically bonded to the substrate support platen 110. Hence, the requirements of building up the electrode circuit and adhering the layers via pressure or heat sensitive adhesives are not required as when polyimide layers are used. Therefore, the process of manufacturing an embodiment of the electrostatic chuck assembly 110 of the present invention may be simplified, providing a more reliable part and improving yield as compared with a traditional chuck assembly manufactured with polyimide films.

Figure 2:
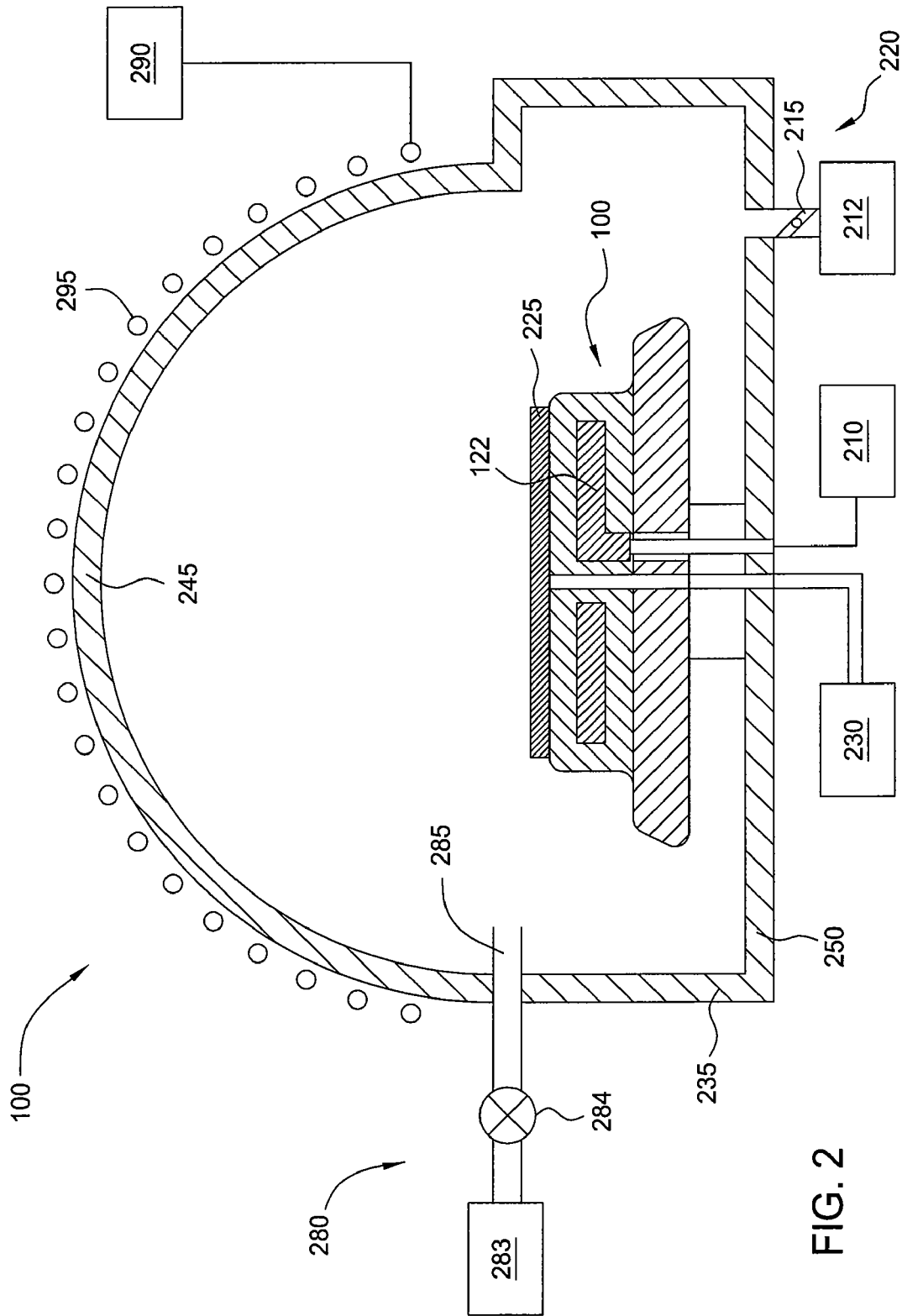
FIG. 2 is a schematic, cross-sectional view of an exemplary processing chamber in which the electrostatic chuck assembly may be utilized.

FIG. 2 is a schematic, cross-sectional view of an exemplary processing chamber 200 in which the electrostatic chuck assembly 100 may be utilized. The exemplary processing chamber depicted may be suitable for plasma etching. However, the electrostatic chuck assembly 100 of the present invention may be used in other chambers performing other processes such as chemical vapor deposition, physical vapor deposition, and ion bombardment.

The processing chamber 200 generally comprises sidewalls 235, a ceiling 245, and a bottom 250, on which the electrostatic chuck assembly 100 may rest. The electrostatic chuck assembly 100 supports and retains a substrate 225, as previously described. Gas may be introduced into the processing chamber 200 by a gas supply 280 having a plurality of nozzles 285 that are fed from a process gas source 283. The gas flow through the nozzles 285 may be controlled by one or more gas valves 284. The gas may be energized to form a plasma by coupling electromagnetic energy, such as radio frequency (RF) or microwave energy, to the gas. In the processing chamber 200, shown in FIG. 2, the gas may be energized inductively by applying an RF voltage from an antenna power supply 290 to an inductor antenna 295 adjacent the ceiling 245 of the chamber 200. Optionally, the gas may be energized capacitively by applying an RF voltage from an electrode voltage supply 210 to the electrode 122 of the electrostatic chuck assembly 100 and electrically grounding the facing ceiling 245. The temperature of the substrate 225 may be controlled through heat transfer gas supplied by a heat transfer gas source 230. Spent gas and byproducts may be exhausted from the chamber 200 through an exhaust system 220, which may include a vacuum pump 212 and a throttle valve 215.

Figure 3:
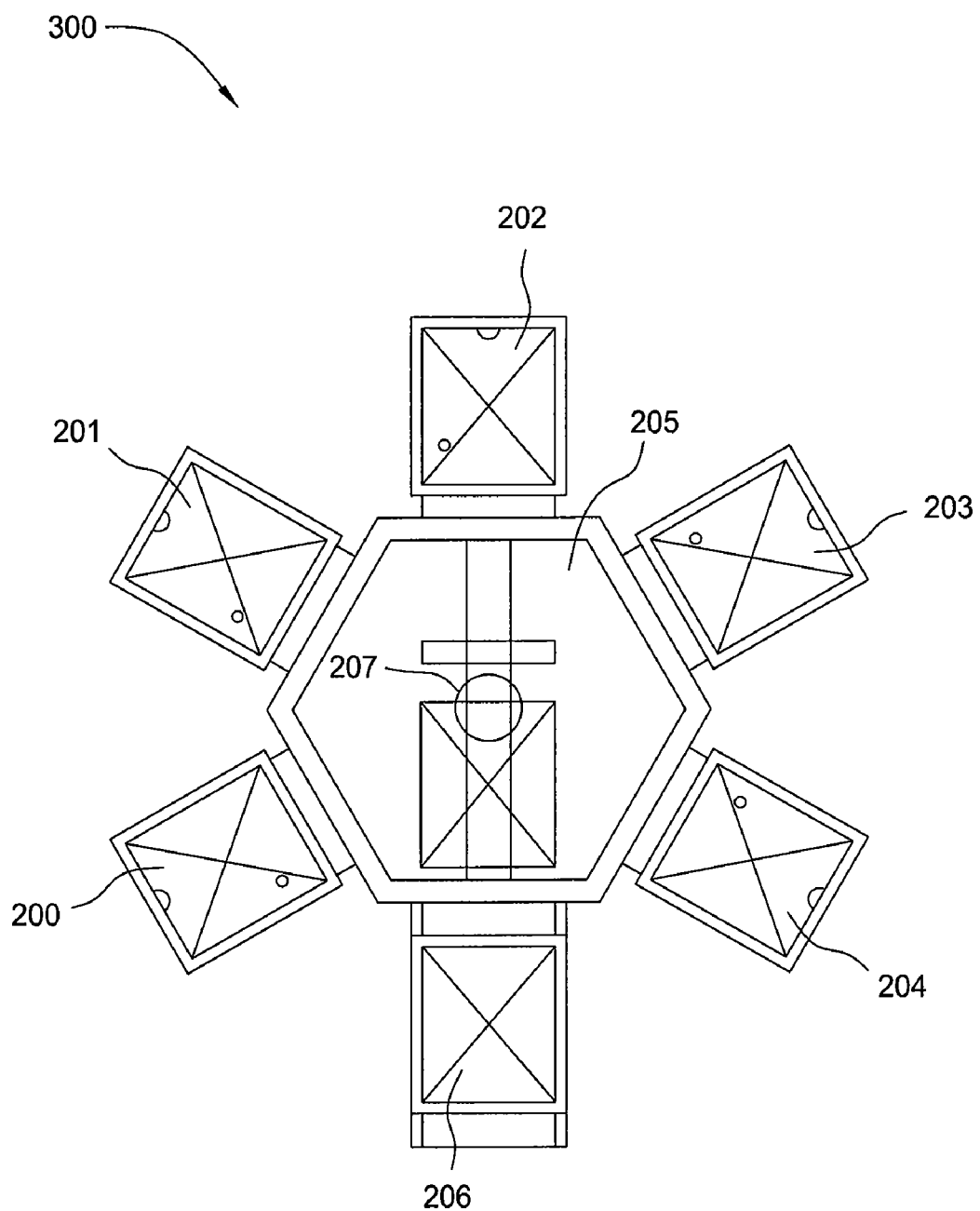
FIG. 3 is a schematic, top, plan view of an exemplary cluster tool in which the exemplary processing chamber may be utilized.

FIG. 3 is a schematic, top, plan view of an exemplary cluster tool 300 in which the exemplary processing chamber 200 may be utilized. The processing chamber 200 may be attached to the cluster tool 300 that contains and provides electrical, plumbing, and other support functions for the processing chamber 200. The cluster tool 300 may have the capability of transferring a substrate 225 between its chambers 200-204 without breaking the vacuum and without exposing the substrate to moisture or other contaminants outside the cluster tool 300. The cluster tool 300 includes a transfer chamber 205 coupled to a load lock chamber 206 and the process chambers 200-204. The load lock chamber 206 allows the substrate 225 to be transferred between the ambient environment outside the system and a vacuum environment within the transfer chamber 205 and process chambers 200-204. The load lock chamber 206 may include one or more evacuatable regions holding one or more substrates 225. The evacuatable regions are pumped down during input of the substrate 225 into the cluster tool 300 and are vented during output of the substrate 225 from the cluster tool 300. The transfer chamber 205 may have a transfer robot 207 disposed therein adapted to transfer the substrate 225 between the load lock chamber 206 and the process chambers 200-204. While five process chambers are shown in FIG. 3, the cluster tool 300 may have any suitable number of process chambers.

While the foregoing is directed to embodiments of the present invention, other and further embodiments of the invention may be devised without departing from the basic scope thereof, and the scope thereof is determined by the claims that follow.

The invention claimed is:

1. A multilayer electrostatic chuck, comprising:
a high-purity polyaryletherketone member having a low concentration of metallic ions, wherein the high-purity polyaryletherketone member is a dielectric material within the electrostatic chuck, and wherein the high-purity polyaryletherketone member includes no greater than one part per million of any one of aluminum, antimony, arsenic, barium, beryllium, bismuth, boron, cadmium, calcium, chromium, cobalt, copper, gallium, germanium, hafnium, indium, iron, lead, lithium, mercury, magnesium, manganese, molybdenum, nickel, niobium, phosphorus, potassium, rubidium, scandium, selenium, silicon, silver, sodium, strontium, sulfur, tantalum, tellurium, thallium, tin, titanium, tungsten, vanadium, yttrium, zinc, and zirconium;
an electrode preformed and embedded within the high-purity polyaryletherketone member; and
a substrate platen, wherein the high-purity polyaryletherketone member is thermoplastically bonded to the substrate platen.

2. The multilayer electrostatic chuck of claim 1, wherein the electrode comprises copper.

3. The multilayer electrostatic chuck of claim 1, wherein the high-purity polyaryletherketone member comprises a first and second layer.

4. The multilayer electrostatic chuck of claim 3, wherein the first and second layer are thermoplastically bonded to one another.

5. The multilayer electrostatic chuck of claim 4, wherein the first layer is thermoplastically bonded to the substrate platen.

6. The multilayer electrostatic chuck of claim 1, wherein the high-purity polyaryletherketone member is resistant to a plasma etching environment.

7. The multilayer electrostatic chuck of claim 6, wherein the plasma etching environment comprises oxygen gas excited by a power source.

8. The multilayer electrostatic chuck of claim 1, wherein the high-purity polyaryletherketone member has a surface area of 10.3 $cm^2$ and has a mass loss of less than 0.14 $g/cm^2$ after 100 hours of exposure to a plasma etching environment comprising 100% oxygen gas.

9. The multilayer electrostatic chuck of claim 1, wherein the polyaryletherketone member is resistant to alkalis, aromatic hydrocarbons, alcohols, and hydrogenated hydrocarbons.

10. The multilayer electrostatic chuck of claim 1, wherein the high-purity polyaryletherketone member is adapted to continuously operate in a processing environment having a temperature of greater than 200° C.

11. The multilayer electrostatic chuck of claim 1, wherein the surface of the high-purity polyaryletherketone member is plasma treated to vary the surface parameters.

12. The multilayer electrostatic chuck of claim 1, wherein the high-purity polyaryletherketone member is resistant to chlorine ($Cl_2$), boron trichloride ($BCl_3$), tetrafluoromethane ($CF_4$), and trifluoromethane ($CHF_3$) gases.

13. An electrostatic chuck assembly, comprising:
a substrate support platen;
a first polyaryletherketone layer having a first surface thermoplastically bonded to the substrate support platen;
a second polyaryletherketone layer having a second surface configured to support a substrate; and
an electrode member preformed and embedded between the second surface of the first polyaryletherketone layer and the first surface of the second polyaryletherketone layer;
wherein the first and second polyaryletherketone layers are thermoplastically bonded together, and wherein the first and second polyaryletherketone layers have less than one part per million of each of aluminum, antimony, arsenic, barium, beryllium, bismuth, boron, cadmium, calcium, chromium, cobalt, copper, gallium, germanium, hafnium, indium, iron, lead, lithium, mercury, magnesium, manganese, molybdenum, nickel, niobium, phosphorus, potassium, rubidium, scandium, selenium, silicon, silver, sodium, strontium, sulfur, tantalum, tellurium, thallium, tin, titanium, tungsten, vanadium, yttrium, zinc, and zirconium.

14. The electrostatic chuck assembly of claim 13, wherein polyaryletherketone layers are surface treated in a plasma environment comprising an oxygen gas excited by a power source.

15. The electrostatic chuck assembly of claim 13, wherein the electrostatic chuck assembly is adapted for continuous use in a thermal environment of 200° C. or more.

* * * * *